US012633727B2

(12) United States Patent
Fujii et al.

(10) Patent No.: US 12,633,727 B2
(45) Date of Patent: May 19, 2026

(54) SEMICONDUCTOR OPTICAL DEVICE

(71) Applicant: NTT, Inc., Tokyo (JP)

(72) Inventors: Takuro Fujii, Tokyo (JP); Shinji Matsuo, Tokyo (JP); Takuma Tsurugaya, Tokyo (JP)

(73) Assignee: NTT, INC., Tokyo (JP)

( * ) Notice: Subject to any disclaimer, the term of this patent is extended or adjusted under 35 U.S.C. 154(b) by 816 days.

(21) Appl. No.: 17/912,612

(22) PCT Filed: Mar. 30, 2020

(86) PCT No.: PCT/JP2020/014508
§ 371 (c)(1),
(2) Date: Sep. 19, 2022

(87) PCT Pub. No.: WO2021/199137
PCT Pub. Date: Oct. 7, 2021

(65) Prior Publication Data
US 2023/0139692 A1      May 4, 2023

(51) Int. Cl.
*H01S 5/227*        (2006.01)
*H01S 5/042*        (2006.01)
(Continued)

(52) U.S. Cl.
CPC .......... *H01S 5/227* (2013.01); *H01S 5/04256* (2019.08); *H01S 5/12* (2013.01);
(Continued)

(58) Field of Classification Search
CPC ...... H01S 5/2205; H01S 5/2213; H01S 5/222; H01S 5/2224; H01S 5/227; H01S 5/2275; H01S 5/3213
See application file for complete search history.

(56) References Cited

U.S. PATENT DOCUMENTS 10,355,454 B2 * 7/2019 Nakahara ................. G02B 6/42
11,189,991 B2 * 11/2021 Nakahara ................. H01S 5/22
(Continued)

FOREIGN PATENT DOCUMENTS

| JP | 2000208814 A | 7/2000 |
| JP | 2002237657 A | 8/2002 |
| JP | 2016171173 A | 9/2016 |

OTHER PUBLICATIONS

Hasebe et al., "High-Speed Modulation of Lateral p-i-n Diode Structure Electro-Absorption Modulator Integrated With DFB Laser," Journal of Lightwave Technology, vol. 33, No. 6, Mar. 15, 2015, pp. 1235-1240.

(Continued)

*Primary Examiner* — James A Menefee
(74) *Attorney, Agent, or Firm* — Slater Matsil, LLP

(57) ABSTRACT

There are included: a second semiconductor layer of a second conduction-type formed to be on and in contact with the active layer; and a third semiconductor layer of a second conduction-type formed on the second semiconductor layer, the third semiconductor layer is arranged above a formation region of the active layer, a bottom surface of the third semiconductor layer is arranged in the formation region of the active layer, and a width of the third semiconductor layer, on the active layer side, in a direction perpendicular to a waveguide direction and parallel to a plane of a substrate is set to be smaller than a width of the active layer in the same direction.

18 Claims, 10 Drawing Sheets

(51) Int. Cl.
    *H01S 5/12*        (2021.01)
    *H01S 5/22*        (2006.01)
    *H01S 5/32*        (2006.01)

(52) U.S. Cl.
    CPC .......... *H01S 5/2275* (2013.01); *H01S 5/2213*
        (2013.01); *H01S 5/2224* (2013.01); *H01S*
        *5/3213* (2013.01)

(56) References Cited

U.S. PATENT DOCUMENTS

| | | | | |
|---|---|---|---|---|
| 2003/0106987 A1* | 6/2003 | Komaba | ............... | H10F 39/811 |
| | | | | 250/214.1 |
| 2003/0138981 A1* | 7/2003 | Yamaguchi | ......... | H01S 5/32341 |
| | | | | 438/22 |
| 2005/0176165 A1* | 8/2005 | Kishimoto | ............ | G11B 7/127 |
| | | | | 438/48 |
| 2006/0093003 A1* | 5/2006 | Moon | ................... | B82Y 20/00 |
| | | | | 372/45.01 |
| 2009/0141764 A1* | 6/2009 | Yagi | ..................... | H01S 5/2231 |
| | | | | 372/45.01 |
| 2013/0208751 A1* | 8/2013 | Nakahara | .................. | H01S 5/12 |
| | | | | 372/45.011 |

OTHER PUBLICATIONS

Matsuo et al., "Room-temperature continuous-wave operation of lateral current injection wavelength-scale embedded active-region photonic-crystal laser," Optics Express, vol. 20, No. 4, Feb. 13, 2012, pp. 3773-3780.

Matsuo et al., "High-speed ultracompact buried heterostructure photonic-crystal laser with 13 fJ of energy consumed per bit transmitted," Nature Photonics, vol. 4, Sep. 2010, pp. 650-654.

Matsuo et al., "Directly modulated buried heterostructure DFB laser on SiO2/Si substrate fabricated by regrowth of InP using bonded active layer," Optics Express, vol. 22, No. 10, May 2014, pp. 12139-12140.

Okamoto, et al., "Optically Pumped Membrane BH-DFB Lasers for Low-Threshold and Single-Mode Operation," IEEE Journal of Selected Topics in Quantum Electronics, vol. 9, No. 5, Sep./Oct. 2003, pp. 1361-1366.

\* cited by examiner

HOLE DENSITY DISTRIBUTION

RADIATIVE RECOMBINATION
DISTRIBUTION

SEMICONDUCTOR OPTICAL DEVICE

CROSS-REFERENCE TO RELATED APPLICATIONS

This application is a national phase entry of PCT Application No. PCT/JP2020/014508, filed on Mar. 30, 2020, which application is hereby incorporated herein by reference.

TECHNICAL FIELD

The present invention relates to a semiconductor optical device with a heterostructure.

BACKGROUND

There is recently being requested lower power consumption on optical devices for short-distance optical communication, due to increasing communication volume in data centers and the like. To handle this request, there have been developed optical devices having a buried heterostructure formed in a stacked structure in which a plurality of thin semiconductor layers are stacked (Non-Patent Literatures 1 to 5). The buried heterostructure is a structure in which a semiconductor (active layer) having larger refractive index and bandgap is sandwiched by semiconductors having smaller refractive indices and bandgaps than those of the active layer in the up-down and right-left directions. This structure can improve a coefficient, of light confinement to the active layer, which largely contributes to various kinds of performance of a semiconductor optical device.

A device having the buried heterostructure in the thin film structure as above is characterized by a contrivance that power consumption is maintained to be low by using a semiconductor multilayer structure typically with about 250 nm to 500 nm of thickness to make the volume of the semiconductor active layer small. Moreover, for the active layer, there is employed a multiple quantum well (MQW) structure excellent in carrier coupling efficiency.

In the device having such a configuration, the semiconductor structure is made thin in order to attain stronger light confinement by making a layer (cladding) different in refractive index closer to a region which is to be a core. As configurations to perform electric field application and current injection to the active layer, this main device has a vertical pin structure in which semiconductor layers above on and below on the active layer as viewed from the substrate side are of the p-type and the n-type, and a lateral pin structure in which semiconductor layers to the right and the left of the active layer are of the p-type and the n-type. Moreover, in order to perform voltage application, there can also be used an n-p-i-n structure in which semiconductors above on and below on an i-type active layer are of the p-type and the n-type and an n-type semiconductor is formed on the opposite side to the p-type semiconductor as viewed from the active layer.

The vertical pin structure allows light to be guided in the active layer not to be affected by electrodes by forming a p-type layer arranged on the upside of the active layer to be thick in order to make an electrode arranged on the upper portion of the active layer separate from the active layer. Since the vertical pin structure can allow layers, for example, of semi-insulating semiconductor to be arranged on the right and the left of the active layer, it can be a structure small in current leakage.

On the other hand, the lateral pin structure can allow the electrode to be arranged with a displacement from the upper portion of the active layer without the thick p-type layer formed on the upside of the active layer, and provides a configuration basically allowing light guided in the active layer to be scarcely affected by electrodes. Moreover, the lateral pin structure does not need formation of electroconductive layers above on and below on the active layer, can allow arrangement of layers having lower refractive indices than the active layer (semiconductor) which is composed of an insulating material or the like, and can realize higher light confinement to the active layer.

CITATION LIST

Non-Patent Literature

Non-Patent Literature 1: S. Matsuo, T. Fujii, K. Hasebe, K. Takeda, T. Sato, and T. Kakitsuka, "Directly modulated buried heterostructure DFB laser on SiO$_2$/Si substrate fabricated by regrowth of InP using bonded active layer", OPTICS EXPRESS, vol. 22, no. 10, pp. 12139-12147, 2014.

Non-Patent Literature 2: T. Okamoto et al., "Optically Pumped Membrane BH-DFB Lasers for Low-Threshold and Single-Mode Operation", IEEE JOURNAL OF SELECTED TOPICS IN QUANTUM ELECTRONICS, vol. 9, no. 5, pp. 1361-1366, 2003.

Non-Patent Literature 3: S. Matsuo, K. Takeda, T. Sato, M. Notomi, A. Shinya, K. Nozaki, H. Taniyama, K. Hasebe, and T. Kakitsuka, "Room-temperature continuous-wave operation of lateral current injection wavelength-scale embedded active-region photonic-crystal laser", OPTICS EXPRESS, vol. 20, no. 4, pp. 3773-3780, 2012.

Non-Patent Literature 4: S. Matsuo1, A. Shinya, T. Kakitsuka, K. Nozaki, T. Segawa, T. Sato, Y. Kawaguchi and M. Notomi, "High-speed ultracompact buried heterostructure photonic-crystal laser with 13 fJ of energy consumed per bit transmitted", NATURE PHOTONICS, vol. 4, pp. 648-654, 2010.

Non-Patent Literature 5: K. Hasebe, T. Sato, K. Takeda, T. Fujii, T. Kakitsuka, and S. Matsuo, "High-Speed Modulation of Lateral p-i-n Diode Structure Electro-Absorption Modulator Integrated With DFB Laser", Journal of Lightwave Technology, vol. 33, no. 6, pp. 1235-1240, 2015.

SUMMARY

Technical Problem

However, the vertical pin structure cannot allow layers of an insulating material to be arranged on the upside and the downside of the active layer, which disables light confinement to the active layer to be very high.

Moreover, while in semiconductor optical devices of this type, semiconductor layers are formed to be on and in contact with the lower surface and the upper surface of the active layer in order to restrain an interface state from arising, the lateral pin structure needs to have the active layer and the upper and lower semiconductor layers sequentially formed in the same process, and it is difficult to make the upper and lower semiconductors semi-insulating. Therefore, there is a problem on the lateral pin structure that the semiconductor layers on the lower surface and the upper surface of the active layer provide leak paths of current. Moreover, there is a problem on the lateral pin structure that the interfaces between the semiconductor layers above on and below on the active layer and the low refractive index layers also provide current leak paths.

Like these, there have been a problem on the conventional technologies that it is not easy to realize high light confinement to the active layer without a leak path of current formed.

Embodiments of the present invention are devised to solve some problem(s) as above, and an object thereof is to realize high light confinement to an active layer without a leak path of current formed.

Means for Solving the Problem

There is provided a semiconductor optical device according to embodiments of the present invention, including: a first low refractive index layer having a lower refractive index than semiconductor, the first low refractive index layer being formed on a substrate; a first semiconductor layer of a first conduction-type formed on the first low refractive index layer; an active layer formed on the first semiconductor layer; a second semiconductor layer of a second conduction-type formed to be on and in contact with the active layer; a third semiconductor layer of the first conduction-type or the second conduction-type formed on the second semiconductor layer, above a formation region of the active layer; non-electroconductive fourth semiconductor layer and fifth semiconductor layer formed on the first semiconductor layer and being in contact with both lateral faces of a ridge pattern with the active layer and the second semiconductor layer; a second low refractive index layer having a lower refractive index than semiconductor, the second low refractive index layer being formed on the fourth semiconductor layer and being in contact with one of lateral faces of a ridge pattern with the third semiconductor layer; a third low refractive index layer having a lower refractive index than semiconductor, the third low refractive index layer being formed on the fifth semiconductor layer and being in contact with another of the lateral faces of the ridge pattern with the third semiconductor layer; a first electrode electrically connecting to the first semiconductor layer; and a second electrode electrically connecting to the third semiconductor layer, wherein a width of the third semiconductor layer, on the active layer side, in a direction perpendicular to a waveguide direction and parallel to a plane of the substrate is set to be smaller than a width of the active layer in the same direction.

There is provided a semiconductor optical device according to embodiments of the present invention, including: a first low refractive index layer having a lower refractive index than semiconductor, the first low refractive index layer being formed on a substrate; a first semiconductor layer of a first conduction-type formed on the first low refractive index layer; an active layer formed on the first semiconductor layer; a second semiconductor layer of a second conduction-type formed to be on and in contact with the active layer; a third semiconductor layer of the first conduction-type or the second conduction-type formed on the second semiconductor layer, above a formation region of the active layer; a second low refractive index layer and a third low refractive index layer having a lower refractive index than semiconductor, the second low refractive index layer and the third low refractive index layer being formed on the second semiconductor layer and being in contact with both lateral faces of a ridge pattern with the third semiconductor layer; a first electrode electrically connecting to the first semiconductor layer; and a second electrode electrically connecting to the third semiconductor layer, wherein a width of the third semiconductor layer, on the active layer side, in a direction perpendicular to a waveguide direction and parallel to a plane of the substrate is set to be smaller than a width of the active layer in the same direction.

Effects of Embodiments of the Invention

As described above, according to embodiments of the present invention, since there is employed a vertical pin structure in which a current is applied to the active layer in the up-down direction and layers having a lower refractive index than semiconductor are arranged above on and below on the active layer, high light confinement to the active layer can be realized without a leak path of current formed.

DETAILED DESCRIPTION OF ILLUSTRATIVE EMBODIMENTS

Figure 1:
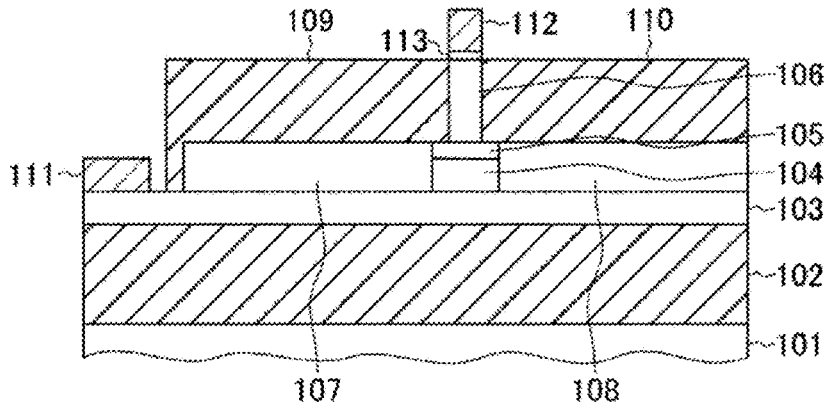
FIG. 1 is a sectional view showing a configuration of a semiconductor optical device according to Embodiment 1 of the present invention.

Hereafter, semiconductor optical devices according to embodiments of the present invention are described.

Embodiment 1

Frist, a semiconductor optical device according to Embodiment 1 of the present invention is described with reference to FIG. 1. This semiconductor optical device firstly includes: a first low refractive index layer 102 having a lower refractive index than semiconductor, the first low refractive index layer 102 being formed on a substrate 101; a first first semiconductor layer 103 of a conduction-type formed on the first low refractive index layer 102; an active layer 104 formed on the first semiconductor layer 103; and a second semiconductor layer 105 of a second conduction-type formed to be on and in contact with the active layer 104. Light is generated in the active layer 104. The active layer

104 is elongated, for example, from this side to the back side of the view plane of FIG. 1. Moreover, the active layer 104 and the second semiconductor layer 105 are formed to have the same area in plan view, and the second semiconductor layer 105 is overlapped with the active layer 104 in plan view.

Moreover, this semiconductor optical device includes: a third semiconductor layer 106 formed on the second semiconductor layer 105; and non-electroconductive fourth semiconductor layer 107 and fifth semiconductor layer 108 formed on the first semiconductor layer 103 and being in contact with both lateral faces of a ridge pattern with the active layer 104 and the second semiconductor layer 105. The third semiconductor layer 106 can be of the second conduction type. Otherwise, the third semiconductor layer 106 can be of the first conduction type.

Here, the third semiconductor layer 106 is arranged above a formation region of the active layer 104. In other words, the bottom surface of the third semiconductor layer 106 is arranged in the formation region of the active layer 104. Moreover, a width of the third semiconductor layer 106, on the active layer 104 side, in a direction perpendicular to the waveguide direction and parallel to the plane of the substrate is set to be smaller than a width of the active layer 104 in the same direction. Notably, the direction perpendicular to the waveguide direction and parallel to the plane of the substrate is a direction sandwiched by the fourth semiconductor layer 107 and the fifth semiconductor layer 108. Notably, as with the active layer 104, the third semiconductor layer 106 is elongated from this side to the back side of the view plane of FIG. 1, for example.

Moreover, this semiconductor optical device includes: a second low refractive index layer 109 having a lower refractive index than semiconductor, the second low refractive index layer 109 being formed on the fourth semiconductor layer 107 and being in contact with one of lateral faces of a ridge pattern with the third semiconductor layer 106; and a third low refractive index layer 110 having a lower refractive index than semiconductor, the third low refractive index layer 110 being formed on fifth semiconductor layer 108 and being in contact with another of the lateral faces of the ridge pattern with the third semiconductor layer 106. Moreover, there are included: a first electrode 111 electrically connecting to the first semiconductor layer 103; and a second electrode 112 electrically connecting to the third semiconductor layer 106. For example, the second electrode 112 can be formed on the third semiconductor layer 106 via a contact layer 113.

The substrate 101 can be composed, for example, of silicon. The first low refractive index layer 102 can be composed, for example, of a material having a lower refractive index than semiconductor that the active layer 104 is composed of, such as silicon oxide, silicon nitride, silicon carbide or diamond. The first low refractive index layer 102 functions as a lower cladding layer as viewed from the substrate 101 side. The first semiconductor layer 103 can be composed, for example, of n-type InP. In this case, the first conduction type is an n-type and the second conduction type is a p-type.

For example, the active layer 104 can be a multiple quantum well structure with a well layer and a barrier layer which are composed of InGaAlAs, InGaAs, InGaAsP or the like having different compositions. Moreover, the active layer 104 can also be composed of compound semiconductor such as bulk InGaAlAs, InGaAs or InGaAsP. The second semiconductor layer 105 can be composed, for example, of p-type InP. In this case, the second conduction type is the p-type. Moreover, the second semiconductor layer 105 can also be composed of semiconductor having a refractive index between those of the third semiconductor layer 106 and the active layer 104. Configuring the refractive index differences as above can attain a separate confined hetero-structure (SCH).

The third semiconductor layer 106 can be composed, for example, of p-type InP. Otherwise, the third semiconductor layer 106 can be composed, for example, of n-type InP. The fourth semiconductor layer 107 and the fifth semiconductor layer 108 can be composed, for example, of i-type InP (i-InP). Otherwise, the fourth semiconductor layer 107 and the fifth semiconductor layer 108 can also be composed of semi-insulating InP (SI-InP) which is given high resistance by doping with Fe or the like.

The second low refractive index layer 109 and the third low refractive index layer 110 can be composed, for example, of a material having a lower refractive index than the semiconductor that the active layer 104 is composed of, such as silicon oxide or silicon nitride. Otherwise, the second low refractive index layer 109 and the third low refractive index layer 110 can also be composed of a resin such as benzocyclobutene (BCB). The second low refractive index layer 109 and the third low refractive index layer 110 function as an upper cladding layer as viewed from the substrate 101. The semiconductor optical device according to Embodiment 1 has a structure of an optical waveguide in which the first low refractive index layer 102 is the lower cladding layer, the active layer 104 is the core, and the second low refractive index layer 109 and the third low refractive index layer 110 are the upper cladding layer.

Now, a semiconductor layer, for example, of p-type InGaAsP or the like can also be arranged between the active layer 104 and the third semiconductor layer 106 (second low refractive index layer 109, third low refractive index layer 110) in the thickness direction (stacking direction). As described for a manufacturing method mentioned later, this semiconductor layer can be caused to function as an etching stop layer for forming the third semiconductor layer 106.

According to the aforementioned configuration, first, there is employed what we call a vertical pin structure in which, as viewed from the substrate 101 side, the right and the left of the active layer 104 are sandwiched by the non-electroconductive fourth semiconductor layer 107 and fifth semiconductor layer 108 and a current is to be applied to the active layer 104 in the up-down direction. Therefore, a leak path of current which becomes a problem on what we call a lateral pin structure is not formed, and the high light confinement to the active layer 104 can be realized.

Moreover, according to the aforementioned configuration, the width of the third semiconductor layer 106 which forms a structure of current injection to the active layer 104 is made smaller than that of the active layer 104 and the second low refractive index layer 109 and the third semiconductor layer 106 are formed at the periphery of the third semiconductor layer 106, therefore, there is attained the state where layers of an insulating material are arranged above on and below on the active layer 104, and the high light confinement to the active layer 104 can be realized.

Next, a manufacturing method of the semiconductor optical device according to Embodiment 1 is described with reference to FIG. 2A to FIG. 2J.

Figure 2A:
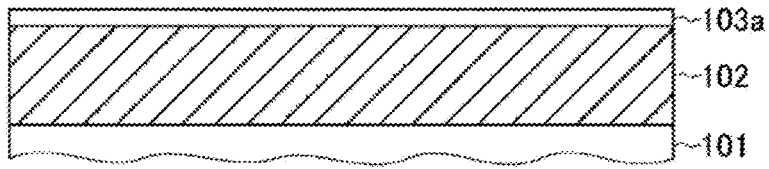
FIG. 2A is a sectional view showing a device structure in the middle of production for explaining a manufacturing method of the semiconductor optical device according to Embodiment 1 of the present invention.

First, as shown in FIG. 2A, the first low refractive index layer 102 is formed on the substrate 101, and a lower InP layer 103a composed, for example, of n-type InP is formed on the first low refractive index layer 102. For example, well-known wafer joining technology can form the lower InP layer 103a on the first low refractive index layer 102. The lower InP layer 103a is a layer to be the first semiconductor layer 103.

Figure 2B:
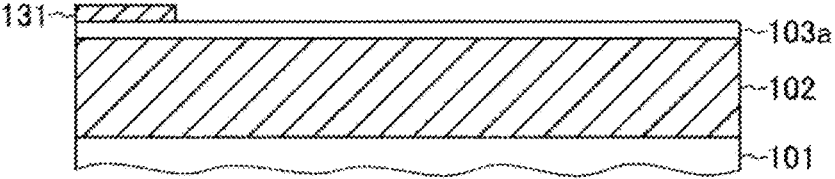
FIG. 2B is a sectional view showing a device structure in the middle of production for explaining a manufacturing method of the semiconductor optical device according to Embodiment 1 of the present invention.

Next, as shown in FIG. 2B, a selective growth mask 131 composed, for example, of silicon oxide is formed at a predetermined place on the lower InP layer 103a. The selective growth mask 131 can be formed, for example, by performing sputtering method or the like to deposit silicon oxide and to form a silicon oxide layer and processing (patterning) this silicon oxide layer with known lithography technology and etching technology.

Figure 2C:
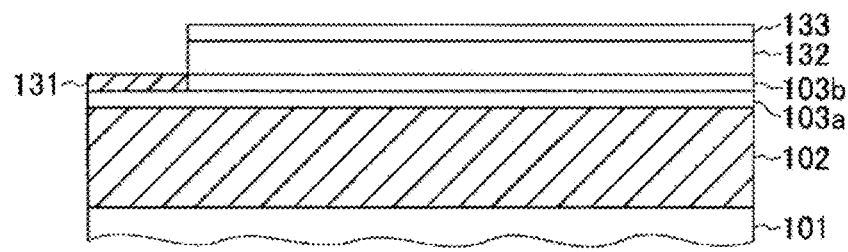
FIG. 2C is a sectional view showing a device structure in the middle of production for explaining a manufacturing method of the semiconductor optical device according to Embodiment 1 of the present invention.

Next, as shown in FIG. 2C, with selective growth using the selective growth mask 131, an upper InP layer 103b, a multiple quantum well layer 132 of InGaAlAs, and an InP cap layer 133 composed of p-type InP are formed on the exposed lower InP layer 103a sequentially in the same growth device. These can be formed through growth by a well-known organometallic vapor phase epitaxy method, molecular beam epitaxy method or the like. The lower InP layer 103a and the upper InP layer 103b constitute the first semiconductor layer 103.

Figure 2D:
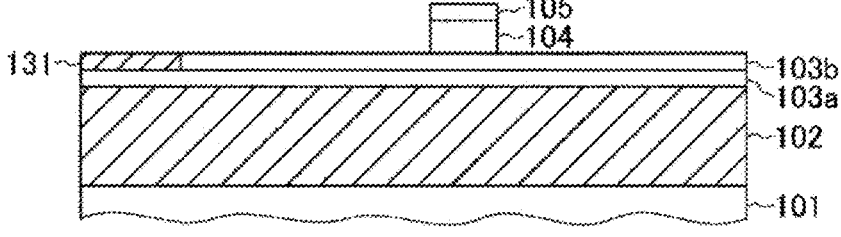
FIG. 2D is a sectional view showing a device structure in the middle of production for explaining a manufacturing method of the semiconductor optical device according to Embodiment 1 of the present invention.

Next, as shown in FIG. 2D, the active layer 104 and the second semiconductor layer 105 are formed on the upper InP layer 103b by patterning the multiple quantum well layer 132 and the InP cap layer 133 with etching technology using a mask (not shown) of an inorganic material (for example, silicon oxide) formed by known lithography technology. The active layer 104 and the second semiconductor layer 105 are formed to have widths, in plan view, of 800 nm, for example. Moreover, the lower InP layer 103a, the upper InP layer 103b, the active layer 104 and the second semiconductor layer 105 are formed to have the total thickness of 250 nm.

Figure 2E:
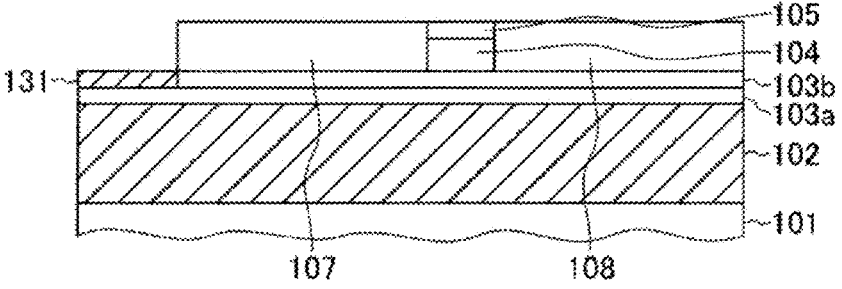
FIG. 2E is a sectional view showing a device structure in the middle of production for explaining a manufacturing method of the semiconductor optical device according to Embodiment 1 of the present invention.

Next, using the selective growth mask 131 and the aforementioned mask of the inorganic material having been used in the formation (patterning) of the active layer 104 and the second semiconductor layer 105 as a selective growth mask, non-doped InP or semi-insulating InP is regrown on the upper InP layer 103b that is exposed on the peripheries of the active layer 104 and the second semiconductor layer 105. This growth of InP can be performed by a well-known organometallic vapor phase epitaxy method, molecular beam epitaxy method or the like. As shown in FIG. 2E, this results in formation of the fourth semiconductor layer 107 and the fifth semiconductor layer 108. Next, as shown in FIG. 2F, an etching stop layer 114 composed of p-type InGaAsP is formed on the second semiconductor layer 105, the fourth semiconductor layer 107, and the fifth semiconductor layer 108.

Figures 2F, 2G:
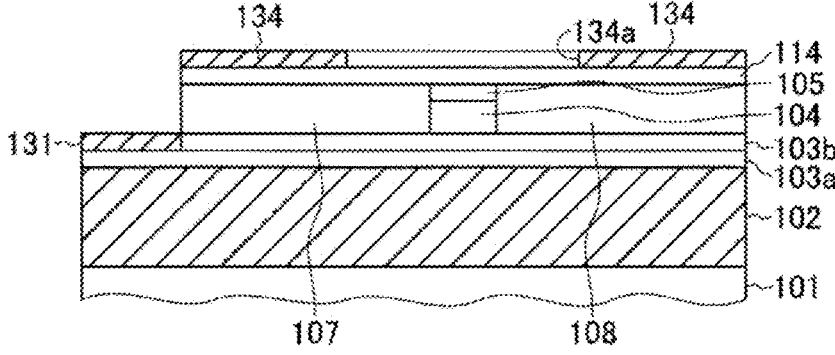
FIG. 2F is a sectional view showing a device structure in the middle of production for explaining a manufacturing method of the semiconductor optical device according to Embodiment 1 of the present invention.
FIG. 2G is a sectional view showing a device structure in the middle of production for explaining a manufacturing method of the semiconductor optical device according to Embodiment 1 of the present invention.
Figure 2H:
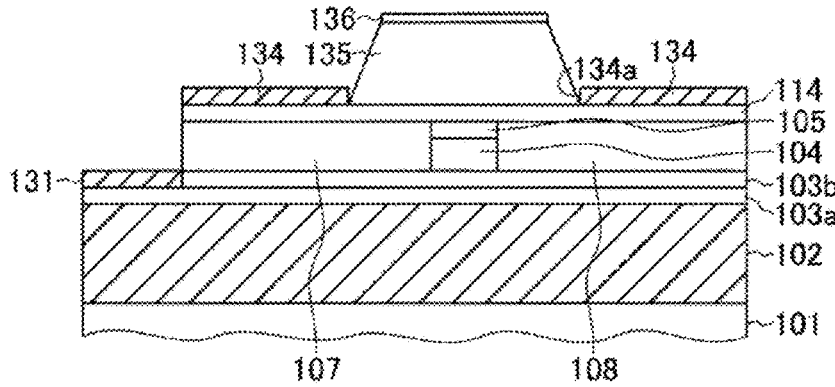
FIG. 2H is a sectional view showing a device structure in the middle of production for explaining a manufacturing method of the semiconductor optical device according to Embodiment 1 of the present invention.

Next, as shown in FIG. 2G, a selective growth mask 134 which includes an opening 134a in a predetermined region is formed on the etching stop layer 114. For example, the selective growth mask 134 is formed to be in the state of enclosing the periphery of the active layer 104 the shape of which in plan view is set to be rectangular. For example, the selective growth mask 134 is formed to be in the state where the active layer 104 is arranged in the center part of the opening 134a in plan view. Notably, the width of the selective growth mask 134 in plan view is in the same state, in any of the width direction and the elongation direction of the active layer 104 in plan view.

Next, through selective growth using the selective growth mask 134, p-type InP is grown on the etching stop layer 114 that is exposed in the opening 134a to form an InP layer 135. Moreover, p-type InGaAs is subsequently grown on the InP layer 135 to form an InGaAs layer 136, for example, to have about 1000 nm of thickness. Herein, the width of the opening 134a in the planar direction of the substrate 101 can be about 1 μm to 50 μm, for example. The InGaAs layer 136 becomes the third semiconductor layer 106.

Since as mentioned above, the InGaAs layer 136 is formed to have a smaller area in plan view by using the selective growth mask 134, large residual stress can be more prevented from arising as compared with the case where this layer is formed on the whole region of the etching stop layer 114. For the growth of the InP layer 135, there is used the organometallic vapor phase epitaxy method, the molecular beam epitaxy method or the like, as with those of the semiconductor layers mentioned above. As is well known, in these growth methods, the process temperature becomes high temperature.

Here, in high temperature processing such as crystal growth as mentioned above, stress arises due to the difference in coefficient of thermal expansion between InP and the substrate 101 composed of silicon.

When the stress arises as mentioned above after the InP layer 135 grows to be thick, there can be a case where just an elastic stress relaxation cannot sufficiently compensate for it and a stress relaxation by the formation of cracks occurs in the InP layer 135. Such formation of cracks in the InP layer 135 leads to a cause of damage to the active layer 104, which is formed to be thin.

Against this, when the area where the InP layer 135 is formed is limited using the selective growth mask 134 as mentioned above, the elastic stress relaxation in the planar direction of the substrate 101 is possible, and cracks in the InP layer 135 in the region of the active layer 104 can be restrained from arising. Forming the InP layer 135 using the selective growth mask 134 as above makes it possible "to produce a thick InP-based layer structure on silicon through crystal growth", which is typically difficult.

Figure 2I:
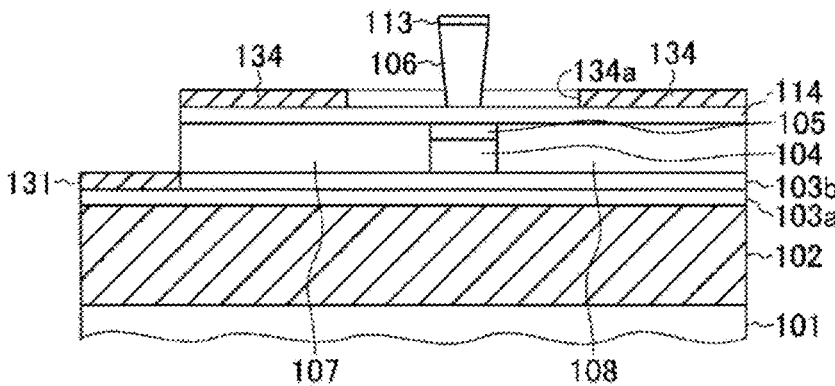
FIG. 2I is a sectional view showing a device structure in the middle of production for explaining a manufacturing method of the semiconductor optical device according to Embodiment 1 of the present invention.

Next, by patterning the InP layer 135 and the InGaAs layer 136 with known lithography technology and etching technology, as shown in FIG. 2I, the third semiconductor layer 106 and the contact layer 113 are formed. After that, the selective growth mask 131 and the selective growth mask 134 are removed.

Figure 2J:
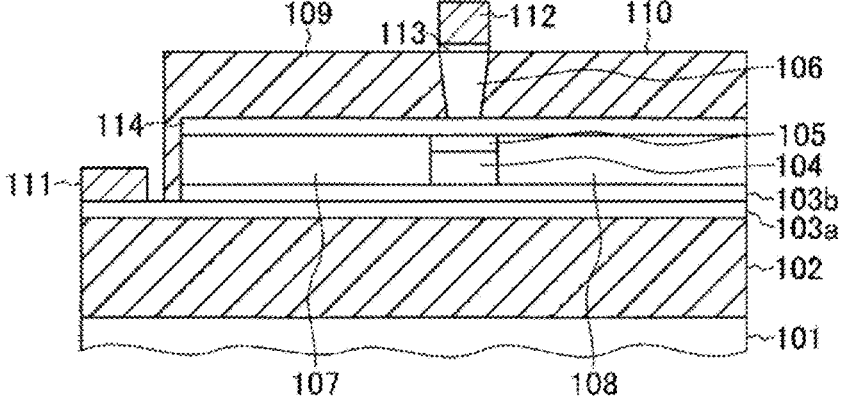
FIG. 2J is a sectional view showing a device structure in the middle of production for explaining a manufacturing method of the semiconductor optical device according to Embodiment 1 of the present invention.

Next, as shown in FIG. 2J, the second low refractive index layer 109 and the third low refractive index layer 110 are formed. The second low refractive index layer 109 and the third low refractive index layer 110 can be formed in the targeted region, for example, by forming a coating film through coating with BCB having photosensitivity and patterning this coating film by known lithography technology. After the second low refractive index layer 109 and the third low refractive index layer 110 are formed as above, the first electrode 111 and the second electrode 112 are formed. These electrodes can be formed, for example, by a well-known lift-off method.

Embodiment 2

Next, a semiconductor optical device according to Embodiment 2 of the present invention is described with reference to FIG. 3. This semiconductor optical device firstly includes: the first low refractive index layer 102 formed on the substrate 101; and the first semiconductor layer 103 of a first conduction-type formed on the first low refractive index layer 102. These are similar to those in Embodiment 1 mentioned above.

Moreover, this semiconductor optical device includes: an active layer 104a formed on the first semiconductor layer 103; and a second semiconductor layer 105a of a second conduction-type formed to be on and in contact with the active layer 104a. While in Embodiment 2, the active layer 104a and the second semiconductor layer 105a is elongated, for example, from this side to the back side of the view plane of FIG. 3, they do not have a buried heterostructure (BH) as in Embodiment 1. In Embodiment 2, there is not formed a buried structure in which the active layer 104a and the second semiconductor layer 105a are sandwiched in the right-left direction of the view plane of FIG. 3.

Notably, the semiconductor optical device according to Embodiment 2 also includes: a third semiconductor layer 106 of the second conduction-type formed on the second semiconductor layer 105a; and second low refractive index layer 109a and third low refractive index layer 110a formed on the second semiconductor layer 105a and being in contact with both lateral faces of the ridge pattern with the third semiconductor layer 106. As with the second low refractive index layer 109 and the third low refractive index layer 110, the second low refractive index layer 109a and the third low refractive index layer 110a can be composed, for example, of a material having a lower refractive index than semiconductor that the active layer 104 is composed of, such as silicon oxide or silicon nitride. Also in Embodiment 2, the third semiconductor layer 106 is arranged above the formation region of the active layer 104a. Moreover, the width of the third semiconductor layer 106, on the active layer 104a side, in the direction perpendicular to the waveguide direction and parallel to the plane of the substrate is set to be smaller than the width of the active layer 104a in the same direction.

Moreover, there are included: the first electrode in electrically connecting to the first semiconductor layer 103; and the second electrode 112 electrically connecting to the third semiconductor layer 106. Also in Embodiment 2, the second electrode 112 can be formed, for example, on the third semiconductor layer 106 via the contact layer 113.

In Embodiment 2, using (utilizing) the refractive index differences of the third semiconductor layer 106 from the second low refractive index layer 109a and the third low refractive index layer 110a, the width of the surface (bottom surface) of the third semiconductor layer 106, on the active layer 104a side, defines the region of light confinement in the right-left direction of the active layer 104a and configures the structure of an optical waveguide.

Also in Embodiment 2, first, there is employed what we call the vertical pin structure in which a current is to be applied to the active layer 104a in the up-down direction as viewed from the substrate 101 side. Therefore, the leak path of current which becomes a problem on what we call the lateral pin structure is not formed, and the high light confinement to the active layer 104a can be realized. Moreover, since also with the aforementioned configuration, layers of an insulating material are arranged above on and below on the active layer 104a, the high light confinement to the active layer 104a can be realized.

Notably, also in Embodiment 2, a semiconductor layer, for example, of p-type InGaAsP or the like can also be arranged between the active layer 104a and the third semiconductor layer 106. As mentioned above, this semiconductor layer can be caused to function as the etching stop layer for forming the third semiconductor layer 106. Moreover, also in Embodiment 2, the second semiconductor layer 105a can be composed of semiconductor having a refractive index between those of the third semiconductor layer 106 and the active layer 104a.

Figure 4:
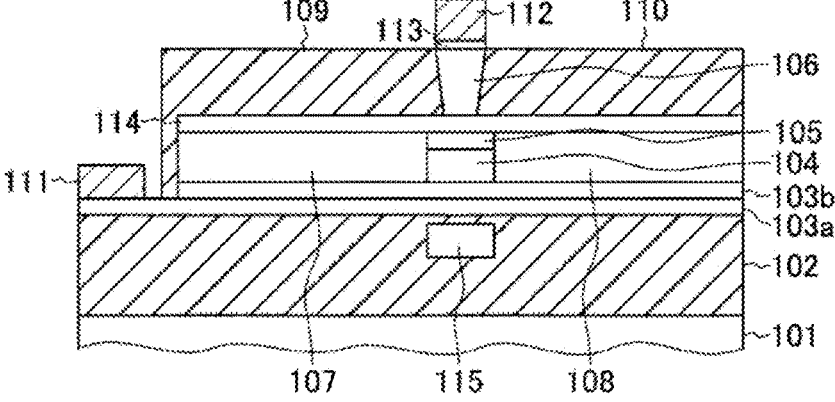
FIG. 4 is a sectional view showing another configuration of the semiconductor optical device according to Embodiment 1 of the present invention.

Now, as shown in FIG. 4, in the semiconductor optical device (refer to FIG. 2J) described for Embodiment 1 mentioned above, there can also be employed a configuration including a core 115 buried in the first low refractive index layer 102 in the region below the active layer 104 (third semiconductor layer 106). The core 115 can be composed, for example, of Si or hydrogenated amorphous silicon. As with the active layer 104, the core 115 is elongated from this side to the back side of the view plane of FIG. 4. For example, the core 115 is separate from the active layer 104 in a range where they can be optically coupled to each other. For example, light generated in the active layer 104 optically couples to the core 115 and can be taken out from the optical waveguide of the core 115.

For example, in the step of the manufacturing method described using FIG. 2A, the core 115 is beforehand formed in the first low refractive index layer 102 by wafer joining technology before the lower InP layer 103a is formed on the first low refractive index layer 102. For example, after the first low refractive index layer 102 that the core 115 is buried in is formed on the substrate 101 and its surface is flattened by chemical mechanical polishing (CMP), the lower InP layer 103a can be formed. Otherwise, there can also be employed a configuration including a diffraction grating buried in the first low refractive index layer 102 in the region below the active layer 104 (third semiconductor layer 106). Moreover, the diffraction grating can also be formed in the core 115. These configurations also apply to the semiconductor optical device according to Embodiment 2 described using FIG. 3.

Next, there are described the results of examination on the effects of embodiments of the present invention through calculations. The semiconductor optical devices according to the embodiments described above are characterized in that in order to confine light to the active layer 104, the width of the third semiconductor layer 106 in the shape of the cross section perpendicular to the waveguide direction is smaller than the width of the active layer 104. It was herein analyzed, by electromagnetic field distribution simulation, how carriers injected into the active layer 104 diffuse and distribute in the active layer 104.

Hereafter, the results of the analysis by the simulation are described. With the configuration described using FIG. 1, the simulation employed the third semiconductor layer 106 the width of which was 400 nm, and the active layer 104 that had a multiple quantum well structure in which six sets of quantum well layers and barrier layers were stacked. Moreover, the total thickness of the first semiconductor layer 103, the active layer 104, and the second semiconductor layer 105 was 250 nm. Moreover, the width of each of the fourth semiconductor layer 107 and the fifth semiconductor layer 108 was 1 μm. Moreover, 1.6 V of voltage was applied between the first electrode 111 and the second electrode 112.

Figure 5A:
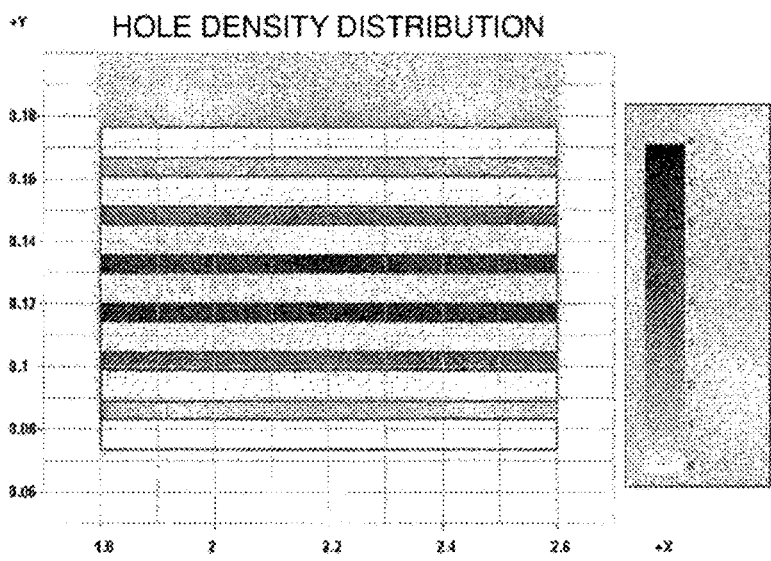
FIG. 5A is a distribution diagram showing the results of analyzing a distribution of holes in the active layer 104 by electromagnetic field distribution simulation.

Under the aforementioned conditions, a hole density distribution was obtained as shown in FIG. 5A, therein, no significant distribution is recognized in the right-left direction of the active layer 104, and a symmetric distribution is shown in the up-down direction thereof. The facts above reveal that in the semiconductor optical device according to the embodiment, holes can be appropriately injected into the active layer 104. Notably, it is clear from FIG. 5A that no holes (carriers) or the like distribute in the barrier layers (white portions). The same holds true for FIG. 5B, FIG. 5C, FIG. 6A and FIG. 6B illustrated below.

Figure 5B:
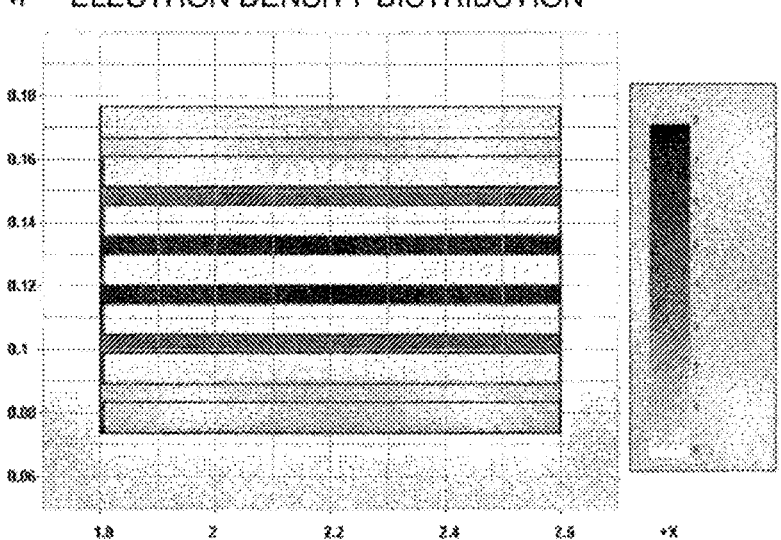
FIG. 5B is a distribution diagram showing the results of analyzing a distribution of electrons in the active layer 104 by electromagnetic field distribution simulation.

Moreover, an electron density distribution was obtained as shown in FIG. 5B, therein, as with the hole density distribution, no significant distribution is recognized in the right-left direction of the active layer 104, and a symmetric distribution is shown in the up-down direction thereof. The facts above reveal that in the semiconductor optical device according to the embodiment, electrons can be appropriately injected into the active layer 104.

Figure 5C:
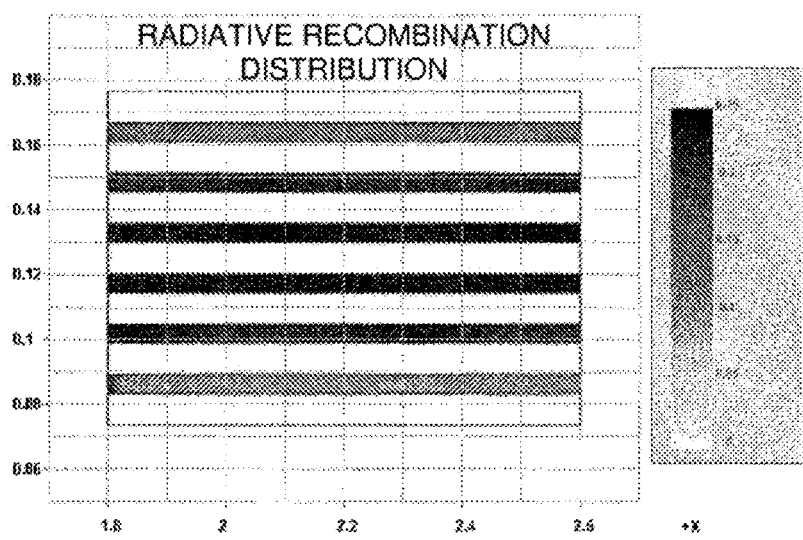
FIG. 5C is a distribution diagram showing the results of analyzing a radiative recombination distribution in the active layer 104 by electromagnetic field distribution simulation.

Moreover, FIG. 5C shows a radiative recombination distribution. Reflecting the hole density distribution and the electron density distribution, there is shown a radiative recombination distribution which is uniform in the right-left direction of the active layer 104 and symmetric in the up-down direction thereof. These results reveal that the semiconductor optical device according to the embodiment can be applied to light-emitting devices such as a laser.

Figure 6A:
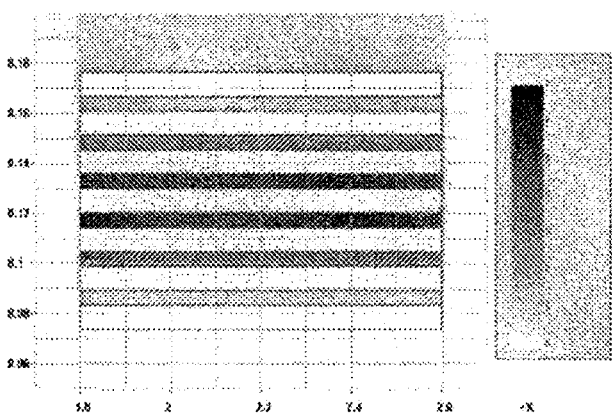
FIG. 6A is a distribution diagram showing the results of analyzing a distribution of holes in the active layer 104 by electromagnetic field distribution simulation.
Figure 6B:
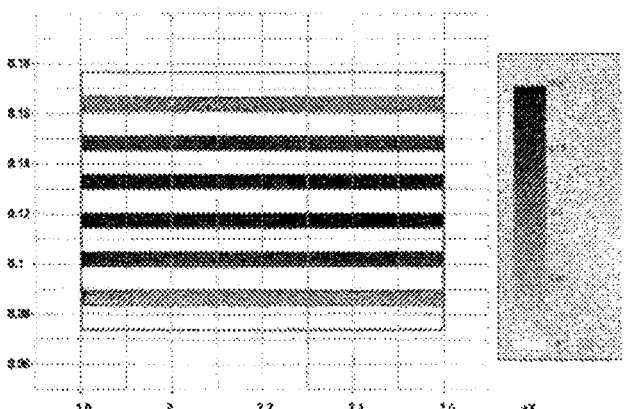
FIG. 6B is a distribution diagram showing the results of analyzing a radiative recombination distribution in the active layer 104 by electromagnetic field distribution simulation.

Next, for the case using the etching stop layer 114 composed of p-type InGaAsP, the results of analyzing a carrier distribution in the active layer 104 by the electromagnetic field distribution simulation as with the above are presented in FIG. 6A and FIG. 6B. In this simulation, the width of the third semiconductor layer 106 was 200 nm. Such a condition to make the width of the third semiconductor layer 106 smaller is in a direction of more restraining in view of diffusion of holes in the right-left direction.

As shown in FIG. 6A, also in the case using the etching stop layer 114, a hole density distribution uniform in the right-left direction of the active layer 104 and symmetric in the up-down direction thereof is obtained. Moreover, as shown in FIG. 6B, also in the case using the etching stop layer 114, a radiative recombination distribution uniform in the right-left direction of the active layer 104 and symmetric in the up-down direction thereof is obtained. Also in such a case where the etching stop layer 114 or the like is used and the width of the third semiconductor layer 106 is made small to be down to 200 nm, it is clear that the semiconductor optical device according to the embodiment can be applied to light-emitting devices such as a laser.

Next, for a more desirable value of the width of the third semiconductor layer 106, the results of examination with two-dimensional mode distribution calculations by a film mode matching method are described. There were employed below the third semiconductor layer 106 the width of which was a variable "x", and the active layer 104 that had a multiple quantum well structure in which six sets of quantum well layers and barrier layers were stacked. Moreover, the thickness of the active layer 104 was 100 nm. Moreover, the total thickness (slab thickness) of the first semiconductor layer 103, the active layer 104, and the second semiconductor layer 105 was 250 nm or 350 nm.

Figure 7A:
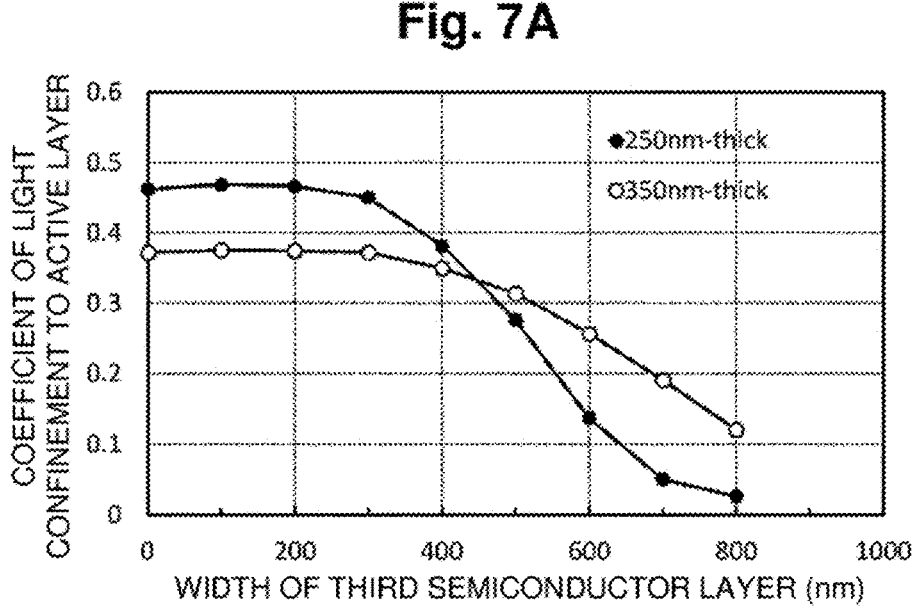
FIG. 7A is a characteristic diagram showing the results of examining a more desirable value of the width of the third semiconductor layer 106 of the semiconductor optical device according to Embodiment 1 described using FIG. 1, on the basis of the coefficient of light confinement to the active layer based on two-dimensional mode distribution calculation by a film mode matching method.
Figure 7B:
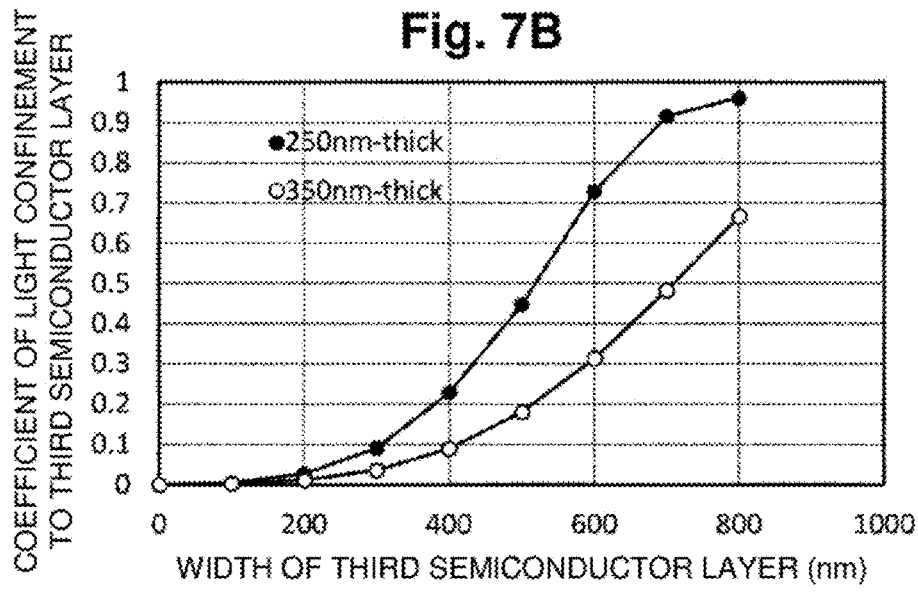
FIG. 7B is a characteristic diagram showing the results of examining a more desirable value of the width of the third semiconductor layer 106 of the semiconductor optical device according to Embodiment 1 described using FIG. 1, on the basis of the coefficient of light confinement to the active layer based on two-dimensional mode distribution calculation by a film mode matching method.

First, the calculation results of the semiconductor optical device according to Embodiment 1 described using FIG. 1 are presented in FIG. 7A and FIG. 7B. In this example, the width of the active layer 104 was 800 nm. At the width "x" of the third semiconductor layer 106 being 0 nm, the coefficient of light confinement to the active layer 104 is about 40%. This corresponds to the same state as that of the conventional lateral pin structure. Being compared with this, as the width of the third semiconductor layer 106 is being made larger, the structure of light confinement to the active layer 104 in the up-down direction is disappearing, the coefficient of light confinement to the active layer 104 is largely lowering, and the coefficient of light confinement to the third semiconductor layer 103 is rising. This corresponding to the similar state to that of the conventional vertical pin structure, which causes deterioration of characteristics, for example, in the case of driving as a laser, such as a rise of an oscillation threshold and a fall of modulation efficiency due to the deterioration of light confinement to the active layer, and a rise of an oscillation threshold and a fall of optical output due to absorption at the valence band originated from the rise of the coefficient of light confinement to the third semiconductor layer.

When the width "x" of the third semiconductor layer 106 is not more than a certain value, it is clear that the coefficient of light confinement to the active layer 104 is not impaired and the coefficient of light confinement to the third semi-conductor layer is still low. Referring to FIG. 7A, it is clear that, for example, when setting it as a reference that the coefficient of light confinement to the active layer 104 is not less than 80% as compared with that at the width "x" of the third semiconductor layer 106 being 0 nm, the width "x" of the third semiconductor layer 106 is still preferably not more than about 400 nm of width at 250 nm of slab thickness, and not more than about 500 nm of width in the case of 350 nm of slab thickness. Likewise, it is also clear that, for example, when setting it as a reference that the coefficient of light confinement to the third semiconductor layer 106 is not more than 20%, the width "x" of the third semiconductor layer 106 is still preferably not more than about 400 nm of width at 250 nm of slab thickness, and not more than about 500 nm of width in the case of 350 nm of slab thickness.

Figure 3:
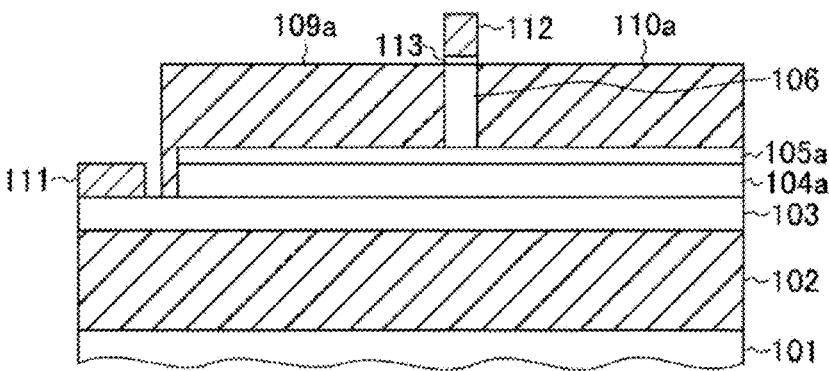
FIG. 3 is a sectional view showing a configuration of a semiconductor optical device according to Embodiment 2 of the present invention.
Figure 7C:
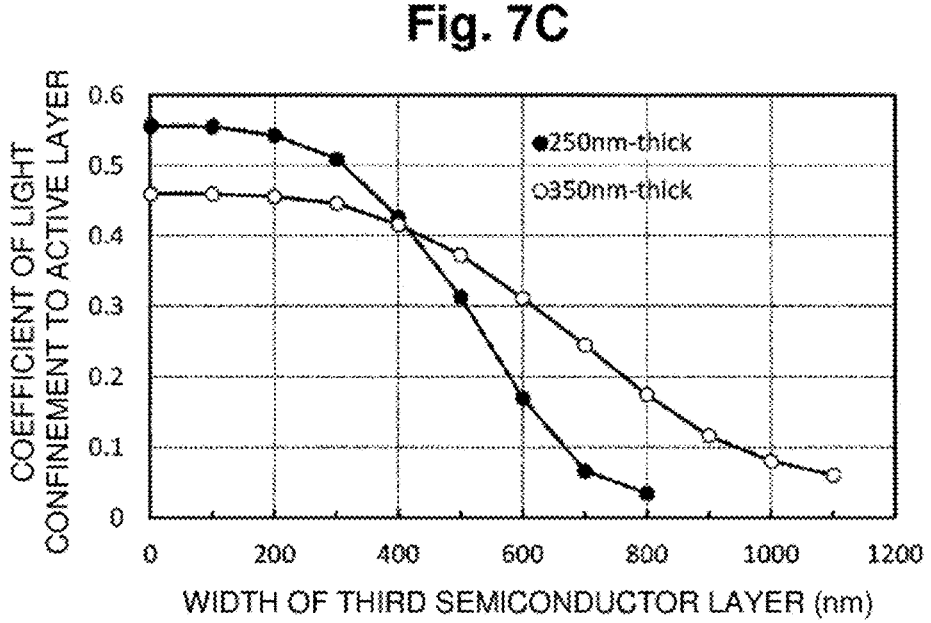
FIG. 7C is a characteristic diagram showing the results of examining a more desirable value of the width of the third semiconductor layer 106 of the semiconductor optical device according to Embodiment 2 described using FIG. 3, on the basis of the coefficient of light confinement to the active layer based on two-dimensional mode distribution calculation by a film mode matching method.
Figure 7D:
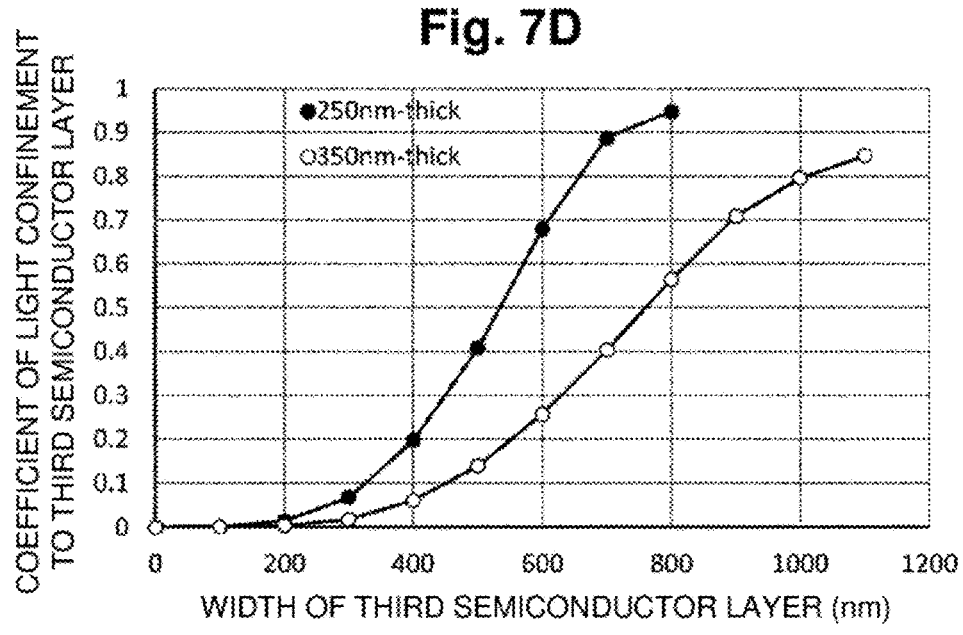
FIG. 7D is a characteristic diagram showing the results of examining a more desirable value of the width of the third semiconductor layer 106 of the semiconductor optical device according to Embodiment 2 described using FIG. 3, on the basis of the coefficient of light confinement to the third semiconductor layer based on two-dimensional mode distribution calculation by a film mode matching method.

Next, the calculation results of the semiconductor optical device according to Embodiment 2 described using FIG. 3 are presented in FIG. 7C and FIG. 7D. Also with this structure, a still preferable width "x" of the third semicon-ductor layer 106 is not very different from that in the aforementioned case, and is 400 nm in the case of 250 nm of slab thickness, and not more than about 500 nm in the case of 350 nm of slab thickness.

The aforementioned results reveal that when the width of the third semiconductor layer 106 is set to be small to a certain extent or less in any of the semiconductor optical devices according to Embodiments 1 and 2, there can be obtained light confinement to the active layer 104a to the similar extent to that with the conventional lateral pin structure. For example, it can be considered that in the case of 250 nm of slab thickness, the width of the third semi-conductor layer 106 is set to be not more than about 400 nm in order to obtain more sufficient light confinement.

Now, while in the aforementioned embodiments, there have been exemplarily illustrated the cases where the third semiconductor layer 106 is mainly of the second conduction type (p-type) and the semiconductor optical device is a light-emitting device such as a laser, the third semiconductor layer 106 can be of the first conduction type (n-type) and be an optical modulator. In this case, it is used under reverse bias application.

As described above, according to embodiments of the present invention, since there is employed a vertical pin structure in which a current is applied to the active layer in the up-down direction and layers of an insulating material are arranged above on and below on the active layer, high light confinement to the active layer can be realized without a leak path of current formed.

Notably, the present invention is not limited to the above-described embodiments, and it is obvious that those skilled in the art can carry out many variations and combinations thereof without departing from the technical concept of the present invention.

REFERENCE SIGNS LIST

101 Substrate
102 First low refractive index layer
103 First semiconductor layer
104 Active layer
105 Second semiconductor layer
106 Third semiconductor layer
107 Fourth semiconductor layer

14

108 Fifth semiconductor layer
109 Second low refractive index layer
110 Third low refractive index layer
111 First electrode
112 Second electrode
113 Contact layer.

The invention claimed is:

1. A semiconductor optical device comprising:
a first low refractive index layer on a substrate, the first low refractive index layer having a lower refractive index than a semiconductor;
a first semiconductor layer of a first conduction-type on the first low refractive index layer;
an active layer on the first semiconductor layer;
a second semiconductor layer of a second conduction-type on and in contact with the active layer, the second semiconductor layer forming a first ridge pattern with the active layer;
a third semiconductor layer on the second semiconductor layer and above the active layer, the third semiconduc-tor layer forming a second ridge pattern;
a fourth semiconductor layer on the first semiconductor layer and being in contact with first lateral faces of the first ridge pattern, the fourth semiconductor layer being non-electroconductive;
a fifth semiconductor layer on the first semiconductor layer and in contact with second lateral faces of the first ridge pattern, the fifth semiconductor layer being non-electroconductive;
a second low refractive index layer on the fourth semi-conductor layer, the second low refractive index layer having a lower refractive index than a semiconductor and being in contact with first lateral faces of the second ridge pattern;
a third low refractive index layer on the fifth semicon-ductor layer, the third low refractive index layer having a lower refractive index than a semiconductor and being in contact with second lateral faces of the second ridge pattern;
a first electrode formed directly on the first semiconductor layer and electrically connected to the first semicon-ductor layer; and
a second electrode electrically connected to the third semiconductor layer, wherein a width of the third semiconductor layer, on the active layer side, in a width direction, which is perpendicular to a waveguide direc-tion and parallel to a plane of the substrate, is smaller than a width of the active layer in the width direction.

2. The semiconductor optical device according to claim 1, wherein the fourth semiconductor layer comprises i-type InP.

3. The semiconductor optical device according to claim 1, wherein the fourth semiconductor layer comprises InP doped with Fe.

4. The semiconductor optical device according to claim 1, wherein the second electrode is disposed on the third semi-conductor layer via a contact layer.

5. The semiconductor optical device according to claim 1, wherein the active layer and the second semiconductor layer have a same area in a plan view, and wherein the second semiconductor layer overlaps with the active layer in the plan view.

6. The semiconductor optical device according to claim 1, wherein a refractive index of the second semiconductor layer is a refractive index between those of the third semi-conductor layer and the active layer.

7. The semiconductor optical device according to claim 1, further comprising:

a core buried in the first low refractive index layer in a region below the active layer.

8. The semiconductor optical device according to claim 1, further comprising:

a diffraction grating buried in the first low refractive index layer in a region below the active layer.

9. The semiconductor optical device according to claim 1, wherein the first low refractive index layer is an insulating material.

10. The semiconductor optical device according to claim 1, wherein the first low refractive index layer is composed of silicon oxide and/or silicon nitride.

11. A semiconductor optical device comprising:

a first low refractive index layer on a substrate, the first low refractive index layer having a lower refractive index than a semiconductor;

a first semiconductor layer of a first conduction-type on the first low refractive index layer;

an active layer on the first semiconductor layer;

a second semiconductor layer of a second conduction-type on and in contact with the active layer, the second semiconductor layer forming a first ridge pattern with the active layer;

a third semiconductor layer on the second semiconductor layer and above the active layer, the third semiconductor layer forming a second ridge pattern;

a fourth semiconductor layer on the first semiconductor layer and being in contact with first lateral faces of the first ridge pattern, the fourth semiconductor layer comprising i-type InP or InP doped with Fe;

a fifth semiconductor layer on the first semiconductor layer and in contact with second lateral faces of the first ridge pattern, the fifth semiconductor layer comprising i-type InP or InP doped with Fe;

a second low refractive index layer on the fourth semiconductor layer, the second low refractive index layer having a lower refractive index than a semiconductor and being in contact with first lateral faces of the second ridge pattern;

a third low refractive index layer on the fifth semiconductor layer, the third low refractive index layer having a lower refractive index than a semiconductor and being in contact with second lateral faces of the second ridge pattern;

a first electrode formed directly on the first semiconductor layer and electrically connected to the first semiconductor layer; and a second electrode electrically connected to the third semiconductor layer, wherein a width of the third semiconductor layer, on the active layer side, in a width direction, which is perpendicular to a waveguide direction and parallel to a plane of the substrate, is smaller than a width of the active layer in the width direction.

12. The semiconductor optical device according to claim 11, wherein the second electrode is on the third semiconductor layer via a contact layer.

13. The semiconductor optical device according to claim 11, wherein the active layer and the second semiconductor layer have a same area in a plan view, and the second semiconductor layer overlaps with the active layer in the plan view.

14. The semiconductor optical device according to claim 11, wherein a refractive index of the second semiconductor layer is a refractive index between those of the third semiconductor layer and the active layer.

15. The semiconductor optical device according to claim 11, wherein the first low refractive index layer is an insulating material.

16. The semiconductor optical device according to claim 11, wherein the first low refractive index layer is composed of silicon oxide and/or silicon nitride.

17. A semiconductor optical device comprising:

a first low refractive index layer on a substrate, the first low refractive index layer having a lower refractive index than a semiconductor;

a first semiconductor layer of a first conduction-type on the first low refractive index layer;

an active layer on the first semiconductor layer;

a second semiconductor layer of a second conduction-type on and in contact with the active layer;

a third semiconductor layer on the second semiconductor layer and above the active layer, the third semiconductor layer forming a ridge pattern;

a second low refractive index layer on the second semiconductor layer, the second low refractive index layer having a lower refractive index than a semiconductor and being in contact with first lateral faces of the ridge pattern of the third semiconductor layer;

a third low refractive index layer on the second semiconductor layer, the third low refractive index layer having a lower refractive index than a semiconductor and being in contact with second lateral faces of the ridge pattern of the third semiconductor layer;

a first electrode formed directly on the first semiconductor layer and electrically connected to the first semiconductor layer;

a second electrode electrically connected to the third semiconductor layer; and a core buried in the first low refractive index layer in a region below the active layer, wherein a width of the third semiconductor layer, on the active layer side, in a width direction, which is perpendicular to a waveguide direction and parallel to a plane of the substrate, is smaller than a width of the active layer in the width direction.

18. A semiconductor optical device comprising:

a first low refractive index layer on a substrate, the first low refractive index layer having a lower refractive index than a semiconductor;

a first semiconductor layer of a first conduction-type on the first low refractive index layer;

an active layer on the first semiconductor layer;

a second semiconductor layer of a second conduction-type on and in contact with the active layer;

a third semiconductor layer on the second semiconductor layer and above the active layer, the third semiconductor layer forming a ridge pattern;

a second low refractive index layer on the second semiconductor layer, the second low refractive index layer having a lower refractive index than a semiconductor and being in contact with first lateral faces of the ridge pattern of the third semiconductor layer;

a third low refractive index layer on the second semiconductor layer, the third low refractive index layer having a lower refractive index than a semiconductor and being in contact with second lateral faces of the ridge pattern of the third semiconductor layer;

a first electrode formed directly on the first semiconductor layer and electrically connected to the first semiconductor layer;

a second electrode electrically connected to the third semiconductor layer; and a diffraction grating buried in the first low refractive index layer in a region below the active layer, wherein a width of the third semiconductor layer, on the active layer side, in a width direction, which is perpendicular to a waveguide direction and parallel to a plane of the substrate, is smaller than a width of the active layer in the width direction.

* * * * *